United States Patent
Thomas et al.

(10) Patent No.: US 6,227,372 B1
(45) Date of Patent: *May 8, 2001

(54) COMPONENT CARRIER TRAY FOR HIGH-TEMPERATURE APPLICATIONS

(75) Inventors: James R. Thomas; Clifton C. Haggard, both of Austin, TX (US)

(73) Assignee: Peak International, Inc., Austin, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/069,828

(22) Filed: Apr. 30, 1998

(51) Int. Cl.[7] .................................................. B65D 85/00
(52) U.S. Cl. ........................ 206/725; 206/454; 206/486; 220/646; 220/729
(58) Field of Search .................................. 206/586, 722, 206/724, 725, 455, 456, 480, 486, 478; 220/507, 646, 4.01, 647, 729, 732

(56) References Cited

U.S. PATENT DOCUMENTS

| | | | |
|---|---|---|---|
| 4,598,821 | * | 7/1986 | LaBarbara et al. ................... 206/329 |
| 5,012,924 | * | 5/1991 | Murphy ............................... 206/722 |
| 5,038,248 | * | 8/1991 | Meyer .................................. 361/212 |
| 5,109,981 | * | 5/1992 | Maston, III et al. ................ 206/331 |
| 5,131,535 | | 7/1992 | O'Connor et al. . |
| 5,203,450 | * | 4/1993 | Benetti ................................ 206/63.5 |
| 5,234,104 | * | 8/1993 | Schulte et al. ....................... 206/330 |
| 5,246,129 | | 9/1993 | Small et al. . |
| 5,310,076 | | 5/1994 | Burton et al. . |
| 5,392,932 | * | 2/1995 | Vongfuangfoo ........................ 211/26 |
| 5,421,455 | | 6/1995 | Clatanoff et al. . |
| 5,428,100 | | 6/1995 | Asai et al. . |
| 5,547,082 | | 8/1996 | Royer et al. . |
| 5,794,783 | * | 8/1998 | Carter .................................. 206/725 |
| 5,794,784 | * | 8/1998 | Murphy ............................... 206/725 |
| 5,848,703 | * | 12/1998 | Murphy et al. ..................... 206/725 |

OTHER PUBLICATIONS

White Paper entitled "High Temperature Compounds" by RTP Co. Imagineering Plastics® (date unknown).

* cited by examiner

Primary Examiner—Paul T. Sewell
Assistant Examiner—Shian Luong
(74) Attorney, Agent, or Firm—Fitzpatrick, Cella, Harper & Scinto

(57) ABSTRACT

A component carrier tray for holding electrical components includes a support frame and a pocket insert supported by the support frame. The frame has at least one opening or concavity therein. The pocket insert is located in the opening or concavity and is formed of a high temperature semi-crystalline polymer. Each pocket insert is adapted to receive and hold at least one electrical component.

61 Claims, 4 Drawing Sheets

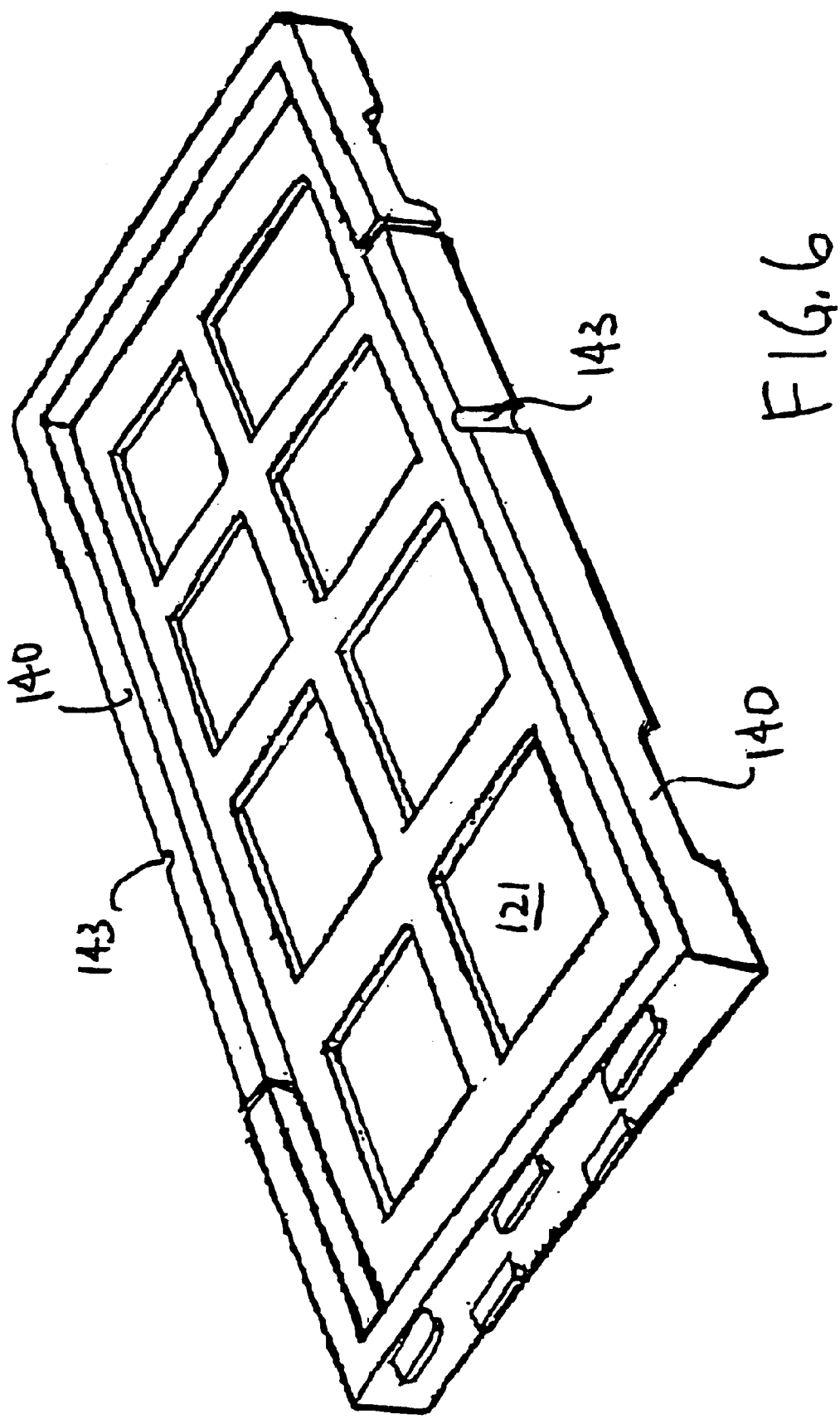

COMPONENT CARRIER TRAY FOR HIGH-TEMPERATURE APPLICATIONS

BACKGROUND OF THE INVENTION

1. Field of the Invention

The present invention relates to a component carrier tray, and more particularly a hybrid carrier tray for high temperature applications.

2. Description of the Related Art

Prefabricated components and chips lie at the heart of most anialog and digital circuits. As these circuits become more prevalent and more complex, it has become increasingly important to those who manufacture and sell the component parts, as well as to those who purchase components and implement circuits using them, that these often delicate or sensitive components can be inspected efficiently and effectively, shipped securely, and handled easily during formation and installation. Similar demands exist with respect to other electrical and mechanical components.

Component manufacturers traditionally handle their parts during production in various forms of transport packaging, one of the most popular being waffle trays. In waffle trays, each tray is formed with a series of depressions or pockets formed in a grid pattern. A component part is inserted into a pocket and transported therein. This system provides an efficient arrangement in which the components can be stored or manipulated by an automated assembly process.

In order to facilitate the handling of these carrier trays, the Joint Electronic Device Engineering Council (JEDEC) has promulgated standards for size and shape. JEDEC standards dictate the form of such exterior features as end tabs for machine manipulation and complementary top and bottom features for stacking.

In addition to facilitating handling of the carrier, it is important in automated production lines to ensure that the components remain oriented properly within the carrier. This permits the machinery to determine the location and orientation of particular components with sufficient accuracy. In addition, the leads of the components are often quite delicate, and therefore susceptible to damage during formation, shipping and storage. Accordingly, it is beneficial to form pockets with interior features, well known in the art, designed to orient and protect the component from being bounced against the interior surfaces of the pocket.

In order to form trays with exterior features meeting JEDEC standards and interior pocket features that will adequately accommodate the components therein, trays are usually injection molded of a thermoplastic resin that is substantially amorphous (rather than crystalline or semi-crystalline) such as polyether sulfone. However, it is our experience that these materials generally do not fare well when exposed to temperatures at or above approximately 200° C. It is becoming common for manufacturers to subject the components to those temperatures and even higher temperatures, often about 250° C., in processes such as "infrared reflow" processing or convection heating to solder connector pins to ball grid array components, or "baking" to remove potentially-damaging trapped moisture from components prior to installation processes. This means that the components must often be removed from the trays before the components can be subjected to such high-temperature processes. It would greatly facilitate the handling of the components if the trays in which they are handled could withstand the higher temperatures encountered in such processes. One thermoplastic of which the present applicants are aware, TORLON® (Amoco), a poly(amide-imide) resin, does exhibit favorable high temperature characteristics. However, it is our experience that the grades of TORLON® that are suitable for use in carrier trays are relatively difficult and time-consuming to mold, and therefore pot particularly well suited to use in component carrier manufacture.

U.S. Pat. No. 5,428,100, to Asai et al., relates to a resin composition intended for use in molded articles such as temperature-resistant trays for integrated circuits or the like. This patent discusses liquid crystal polyesters (LCPs) having various temperature characteristics, some of which would seem to be useful in the high-temperature processes discussed above.

As recognized in the Asai patent, LCP resins can be very difficult to injection mold. It has been our experience that this is also true for other high-temperature "semi-crystalline" materials, such as thermoset polyimide (TPI) resins, polyester ether ketone (PEEK) resins, and polyphthalamide (PPA) resins. These materials have highly ordered molecular structures that contribute to relatively high, sharply defined melt points. However, the molecular orientation of these materials also causes anisotropic shrinkage—shrinking more in the direction transverse to the melt flow than in the direction of the melt flow—as they set during injection molding, leading to unpredictable warpage and/or residual internal stresses. Thus, it can be very difficult to produce relatively large, flat carrier trays from such materials. Further, even if the tray can be formed flat, once it is subjected to high processing temperatures, the residual stresses can relax and cause the tray to flex unpredictably. For example, tests were performed on trays formed of a modified PPA, each having an overall length of approximately 323 mm, an overall width of approximately 136 mm, and an external thickness of approximately 12 mm. When exposed to temperatures of just 150° C. for 24 to 48 hours, the trays would ware unacceptably, with changes in length and width of approximately 0.4 and 0.3 mm, respectively.

The Asai patent proposes a specific material composition to overcome this problem. Examples 10 and 16 of the Asai patent, for example, assert that IC trays molded out of the disclosed LCP exhibit relatively low degrees of warpage in formation add after prolonged exposure to temperatures of 240° C. It would be preferable, however, to be able to produce trays possessed of such properties using any of a variety of widely available molding resins, not just the particular LCP disclosed in the Asai patent.

An alternate approach to that of the Asai patent is to form the trays out of aluminum, steel or other metal. However, in order to form metallic trays with detailed exterior and interior features, they generally have to be machined, greatly increasing the cost of production. Unfortunately, casting metal trays presents similar warpage problems to those encountered in the injection-molding of trays from semi-crystalline resins.

It is known in the art to produce component transport devices that are made of more than one material. For example, U.S. Pat. No. 5,131,535, to O'Connor et al., relates to an electrical device transport medium made of two different materials. A plurality of plastic carrier unit inserts are held in a generally planar relationship by a metallic frame. The carrier units are preferably formed of graphite loaded polyether sulfone, which according to the patent is capable of enduring all the heating and cooling chambers ("soak chambers") through which the electrical devices must pass. The carrier units are latchable into a coordinate matrix of carrier unit holes defined by the frame, and are permitted a small amount of play in a direction perpendicular to the plane of the frame, i.e., in an up-and-down direction. The frame and carrier units are disposed on a bi-level process machine platform during pre-shipment "backend processing." However, the O'Connor patent does not recognize or address the problems associated with processes in which temperatures reach the ranges being considered here (it being our understanding that soak chamber temperatures are not normally higher than about 150° C.).

Another example of a hybrid tray is U.S. Pat. No. 5,547,082, to Royer et al., which discloses a component tray frame with a removable insert that is releasably secured to the frame. The insert has a plurality of pockets for storing the components. The frame is preferably formed of a polymeric material that is thermoset or thermoplastically formed, e.g., polyether sulfone (the traditional tray polymer), or PEEK or TPI (semi-crystalline resins). Metals such as steel and aluminum are also suggested. As for the inserts, those are preferably made of a polymeric material that is adapted to withstand temperatures of approximately 125° C. for periods in excess of 24 hours. Specifically mentioned is polyether sulfone, but not PEEK or TPI. The Royer patent does not recognize the problems encountered in utilizing trays at a temperature of 200° C. or higher.

Therefore, there is a need in the art for a relatively low-cost component carrier tray that can withstand temperatures encountered in high-temperature component processing.

There is a further need for such a carrier that can be formed consistently without unacceptable levels of warpage.

There is yet another need for such a carrier with pockets that can include fine interior features to protect the component held therein.

There is a further need for such a carrier that can include standardized exterior features to facilitate machine handling and/or stacking.

SUMMARY OF THE INVENTION

The present invention addresses the foregoing needs in the art by providing a carrier tray which includes a support frame to which are appended a plurality of semi-crystalline plastic resin pockets shaped to receive and hold components.

The present invention relates to a carrier tray for holding components, and in its preferred embodiment includes a support frame to which plural pockets formed of high-temperature semi-crystalline polymer are appended. Each pocket is shaped to receive and hold a component. Similarly, JEDEC-type exterior features formed of similar material can be appended to the frame as well. The support frame provides structural integrity to the tray, and compensates for any tendency of the semi-crystalline material from which the pockets are formed to warp when molded. The pockets, on the other hand, provide the detailed features desired to accommodate the components. The pockets can be formed as separate inserts that are attachable to the frame. If so, various pocket designs can be used interchangeably with a standard frame design, increasing the ability of the tray to be used with different components. Alternatively, the semi-crystalline pockets can be molded directly onto the frame, either encasing the frame or forming an overlay attached to the frame.

Accordingly, one aspect of the present invention relates to a component carrier tray for holding electrical components. The tray includes a support frame having at least one opening or concavity therein and a pocket insert supported by the frame and located in the opening or concavity. The pocket insert is formed of a high-temperature semi-crystalline polymer and is adapted to receive and hold at least one of the electrical components. The tray can be configured so that the inserts, each of which accommodates a single component, correspond one-to-one with openings or concavities. Alternatively, a single insert, adapted to hold several components, can correspond to either one or more than one opening or cavity.

The pocket insert can include a plurality of pocket inserts secured to the frame. The frame can be a plate having a plurality of openings therein, and each of the pocket inserts can fit within one of the openings. The frame can further include flaps depending from the plate at a periphery of each of the openings, and each pocket insert can further include a flange extending from an upper periphery and a prong extending from a lower periphery of the pocket insert. In this configuration, each pocket insert fits into one of the openings so that when the flange abuts the frame, the prong snaps behind the flap, holding the insert in place.

Additionally, an attachment can be supported by the frame, the attachment also being formed of a high-temperature semi-crystalline polymer and having handling features by which the tray can be machine manipulated. The frame can be substantially rectangular, and the attachment can abut at least part of three edges of the frame. The frame can further include an engagement feature on each of an opposing pair of the three edges abutted by the attachment, each of the engagement features including a projection or a recess. The attachment can then further include complementary features positioned to engage the engagement features of the frame to secure the attachment to the frame, each of the complementary features including the other of a projection or a recess.

The frame can be formed of various materials, e.g., metallic or ceramic. As suitable metals may be mentioned, for example, aluminum alloys or steel. The frame material is preferably stainless steel. Advantageously, the frame is formed of a single sheet of metal.

The semi-crystalline polymer can be a material selected from the group consisting of liquid crystal polyesters, thermoset polyimide, polyester ether ketone, and polyphthalamide. The polymer material is preferably polyester ether ketone.

In another aspect, the present invention relates to a method of forming a component carrier tray for holding electrical components. The method includes the steps of providing a support frame having at least one opening or concavity therein and securing a pocket insert to the frame in the opening or concavity. The pocket insert is formed of a high-temperature semi-crystalline polymer and is adapted to receive and hold at least one of the electrical components.

In yet another aspect, the present invention relates to a component carrier tray for holding electrical components. The trays include a pocket insert formed of a high-temperature semi-crystalline polymer and adapted to receive and hold at least one of the electrical components. Means is provided for supporting the pocket insert so as to compensate for any warpage in the pocket insert.

A still further aspect of the present invention relates to a component carrier assembly. The assembly includes a support frame having at least one opening or concavity therein and a pocket insert supported by the frame and located in the opening or concavity. The pocket insert is formed of a high-temperature semi-crystalline polymer. An electrical component is disposed within the pocket insert.

These and other objects, features and advantages of the present invention will be more apparent from the following detailed description with reference to the following drawings, in which like reference numerals refer to like elements throughout.

BRIEF DESCRIPTION OF THE DRAWINGS

FIG. 6 is a schematic top plan view of a tray according to an alternate embodiment of the present invention.

DETAILED DESCRIPTION OF THE PREFERRED EMBODIMENTS

Figure 1:
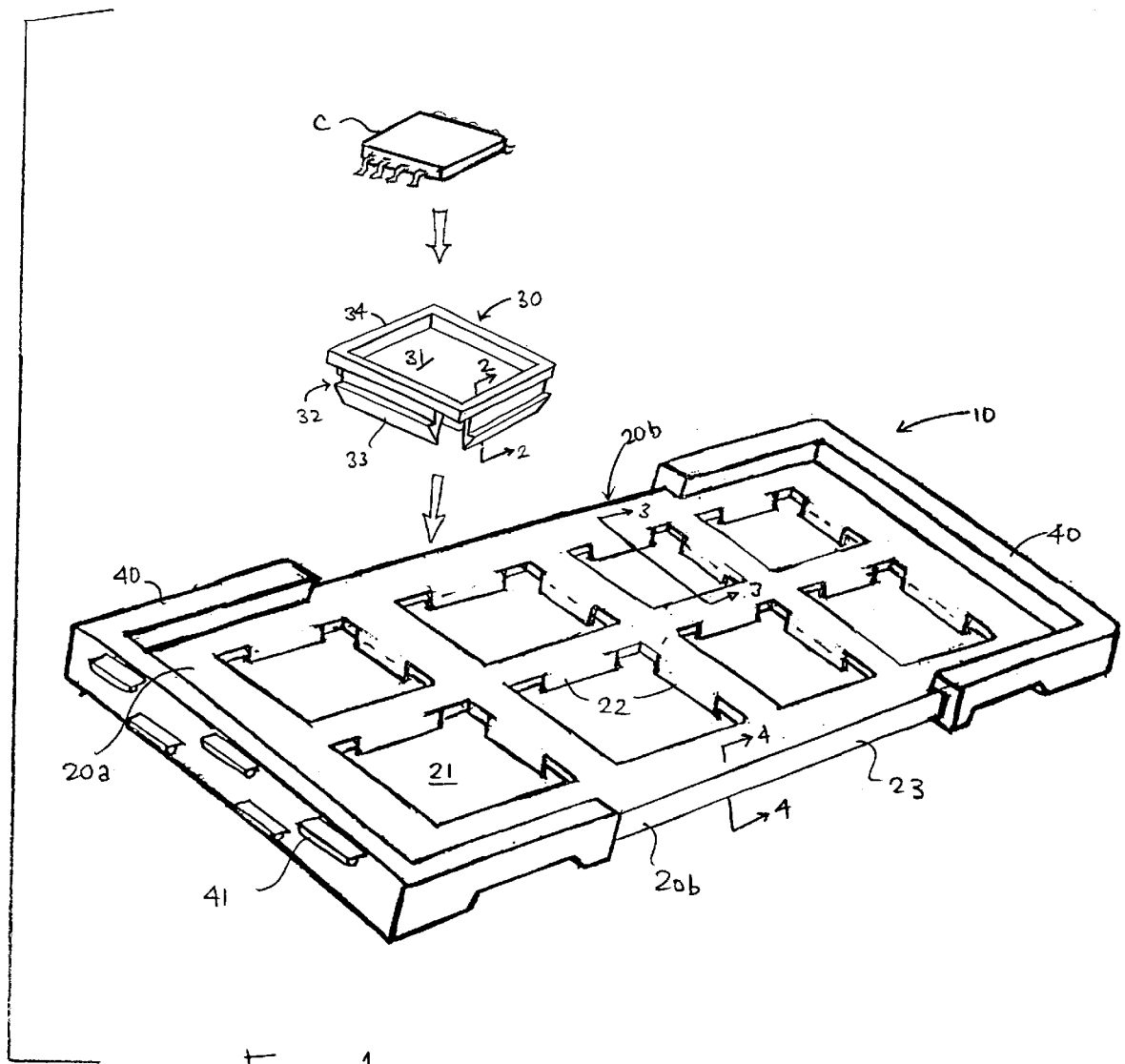
FIG. 1 is a perspective view of a partially assembled tray according to an embodiment of the present invention.

FIGS. 1 through 5 show a carrier tray 10 according to an embodiment of the present invention. FIG. 1 shows the partially-assembled tray 10, which includes a frame 20 to which a pair of attachments 40 have been appended, and an insert 30, a plurality of which can likewise be appended to the frame 20. Each insert 30 contains a pocket 31 in which the component C is held, and it can be formed with whatever interior features (not shown) are desired to accommodate the components. The attachments 40 provide whatever exterior features, such as JEDEC end tabs 41, that are desired for the tray 10. The inserts 30 and attachments 40 are formed of a high-temperature semi-crystalline resin. Here, "high temperature" means able to withstand temperatures of about 200° C. or higher for periods longer than typically encountered in component processing (i.e., a few minutes to approximately 48 hours, depending on the process) while retaining useful levels of strength and stiffness. These resins can typically retain useful levels of strength and stiffness above their glass transition temperatures. Such resins include materials such as a liquid crystal polyester (LCP) resin, a thermoset polyimide (TPI) resin, a polyester ether ketone (PEEK) resin, or a polyphthalamide (PPA) resin. Preferably, the inserts and attachments are formed of PEEK.

In this embodiment, the frame 20 includes a series of openings 21 through its face 20a. The inserts 30 can be latched into these openings 21. It is preferred that the openings 21 be oriented in a regular array, as in a standard component carrier tray. In this embodiment, each opening 21 is substantially rectangular, but it may be any suitable shape to accommodate the inserts 30, which in turn are shaped to accommodate the components for which the tray is designed.

Figure 5:
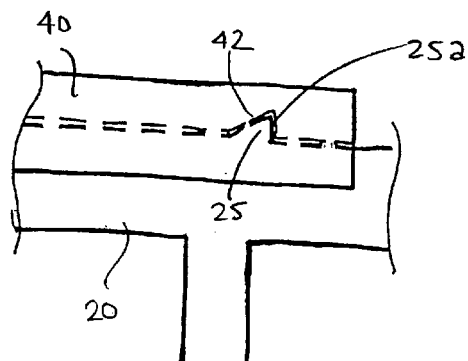
FIG. 5 is a detailed schematic of the engagement between the attachment and frame shown in FIG. 1.
Figure 4:
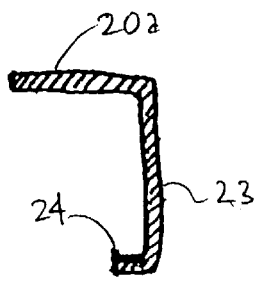
FIG. 4 is a cross section taken along the line 4—4 in FIG. 1.
Figure 3:
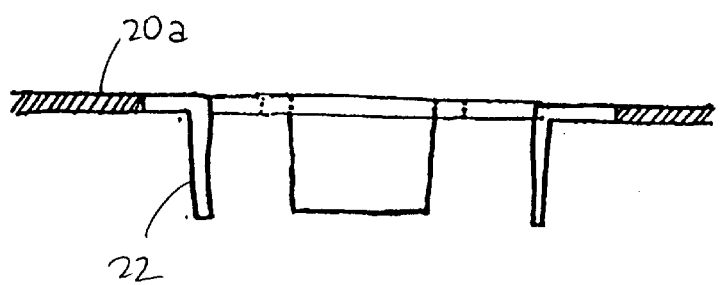
FIG. 3 is a cross section taken along the line 3—3 in FIG. 1.

Although not necessary to the invention, flaps 22 preferably depend from the frame 20 at the periphery of each opening 21, as best seen in FIG. 3. These flaps 22 facilitate engagement of the frame by the inserts 30, as discussed later. Similarly, it is preferred that a skirt 23 depend from the perimeter of the frame 20 for engagement by the attachments 40, as discussed later. As shown in FIG. 4, it is also preferred that a lip 24 extend inwardly at the bottom of the skirt 23. As shown in FIG. 5, a tab 25 is provided near each corner on both sides 20b of the frame. In this embodiment, the tab 25 is wedge-shaped and tapered toward the corner, and includes a relatively flat abutment surface 25a remote from the corner. As will be discussed later, this tab 25 helps to secure the engagement between the frame and the attachments 40.

It is preferred that the frame 20 be formed from a plate or sheet of stainless steel. This material exhibits sufficient stiffness and durability, and has gained acceptance in the industry for use with heat processes. The plate and the openings 21 can be formed initially by stamping or other like process. During this initial stage, extra material can be left extending out from the perimeter of the plate and in from the periphery of the openings. This extra material can then be folded down to form the flaps 22, skirt 23 and lip 24. Similarly, each tab 25 can be formed by cutting around its periphery on all but its inner-most side. As the plate is bent to form the skirt 23, the tab 25 remains flush with the face 20a of the frame so as to extend laterally therefrom. It should be noted that the frame 20 need not include the above-discussed flaps 22, skirt 23 and lip 24. Rather, the frame can simply be a flat plate with openings 121 therethrough, as in the embodiment shown in FIG. 6, or with a series of depressions in which the inserts fit.

In an alternate embodiment, the steel from which the frame 20 is formed can be anodized to reduce its reflectivity, which would be helpful for use with automated visual inspection systems. Other materials that have sufficient rigidity and temperature tolerance can be used as well. For example, ceramics or other metals, such as other steels and aluminum alloys, that do not expand unacceptably at high temperatures, can be used.

In the illustrated embodiment, the inserts 30 include pockets 31, which provide the detailed features (not shown) for accommodating the components, and are therefore component-specific. These features are well known in the art. As with the openings 21, the shape of the inserts 30 are not critical, so long as the pockets 31 accommodate the components, and the exteriors of the inserts substantially match the openings 21 in the tray for which they are designed. In this embodiment, the inserts 30 are substantially rectangular.

Figure 2A:
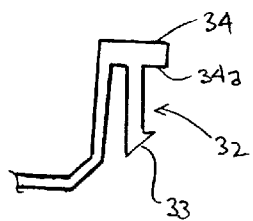
FIG. 2A is a cross section taken along the line 2—2 in FIG. 1.

The inserts 30 of this embodiment are configured to snap-fit into the openings 21 of the frame 20. Referring to FIGS. 1 and 2A, branches 32 depend from the periphery of the inserts 30, with tapered prongs 33 at the bottom of the branches 32, in order to facilitate the snap-fit between the inserts 30 and the frame 20. A flange 34 extends from the upper periphery of the insert 30. The insert 30 fits within the opening 21 so that the underside 34a of the flange 34 abuts the face 20a of the frame and the prongs 33 snap behind the peripheral flaps 22 of the openings 21.

Figure 2B:
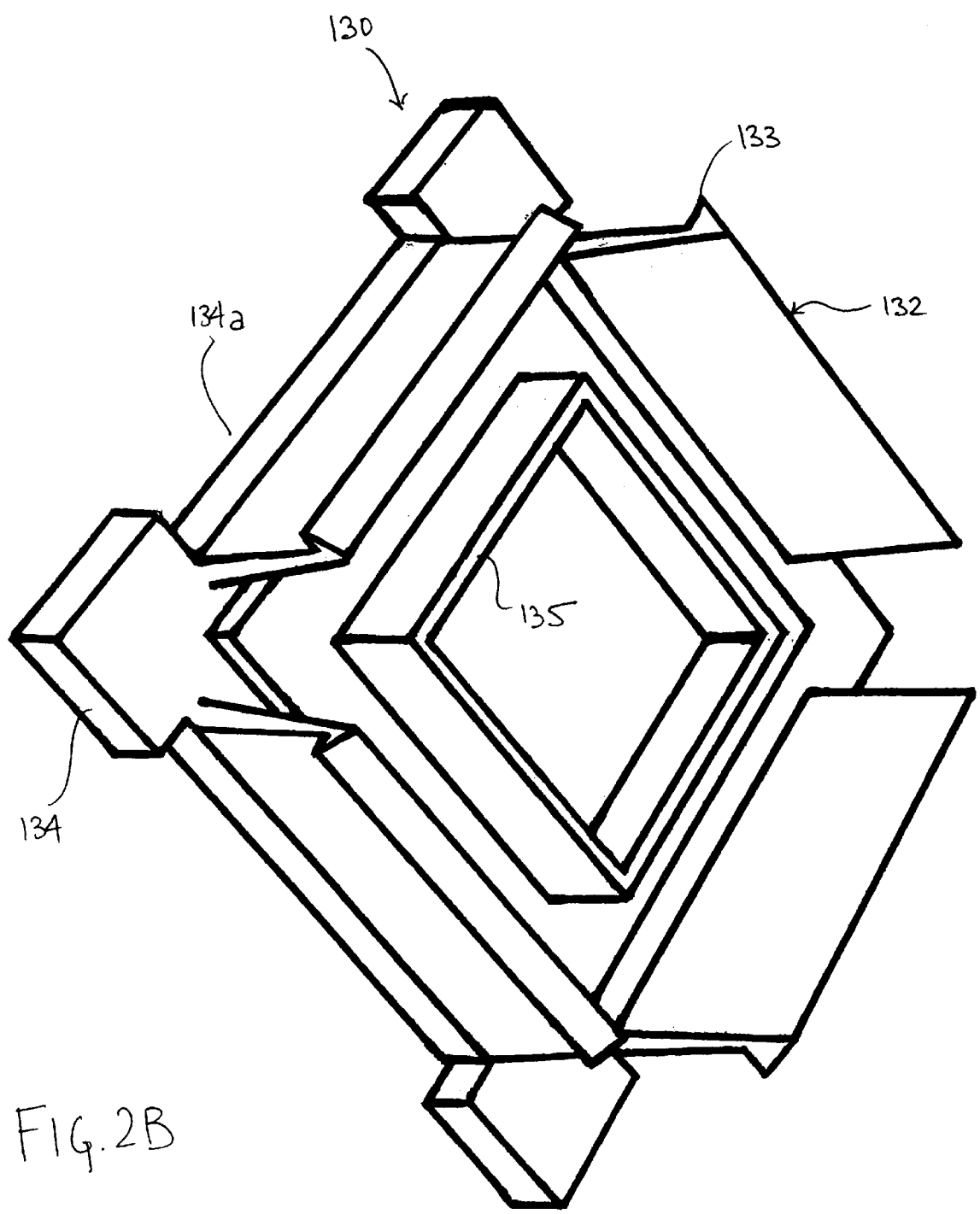
FIG. 2B is a bottom perspective view of an insert usable with the tray shown in FIG. 1.

FIG. 2B shows the underside of a different embodiment of the insert 130, usable with the frame 20. In this embodiment, the branches 132 and prongs 133 are substantially the same as those discussed with the previous embodiment. The underside 134a of the flange 134 abuts the face of the frame, just as in the previous embodiment. The flange 134 is shaped slightly differently, however, having side cut-out 134a on each side. The cut-outs 134a are provided directly above the prongs 133 imply to permit the insert 130 to be readily two-part press molded, as will be appreciated by those skilled in the art. As shown in this view, the pockets can also be provided with underside features 135 shaped to hold a component in a pocket of a tray below when the trays 10 are stacked one upon another. This feature is also well-known in the art.

In the illustrated embodiments, the branches depend from all four sides of the insert. However, it would be acceptable to provide branches on fewer sides, so long as a reliable snap-fit is obtained. For example, the branches can be provided on two opposing sides of the insert, while the remaining two sides are shaped to closely abut the opening 21.

Further, the prongs do not necessarily have to be formed on separate branches. Rather, the prongs can be provided directly on the outer surface of the pocket. The branches merely provide more flexibility to facilitate insertion and removal of the inserts into and from the openings 21.

In the illustrated embodiments, a single pocket is provided in each insert. Alternately, multiple pockets can be provided per insert. In any case, it is preferred that the pockets be provided in a one dimensional array (i.e., one column or row) in the insert. This permits the frame 20 to better compensate for any warpage in the insert.

In the illustrated embodiment, a complementary pair of attachments 40 are snap-fit onto the perimeter of the frame 20. The attachments 40 include any desired exterior features, such as the JEDEC end tabs 41. The attachments 40 fit against the end and extend partially up either side 20b of the frame 20. As can be best seen in FIG. 5, each attachment includes a groove into which the edge of the frame fits. At the base of the groove are notches 42 which correspond to and snap fit over the tabs 25 on the sides of the frame in order to hold the attachment 40 to the frame 20. It should be noted that, while the notches 42 and the tabs 25 should be complementary, the particular shape of these features is not crucial, so long as they cooperate to secure the attachments 40 to the frame 20. For example, the features can be reversed, with the frame 20 being provided with a notch into which a tab on the attachment 40 fits. The notch can be a detent or an aperture. The tab can have a profile and/or cross section that is round (e.g., circular or ellipsoidal) rather than rectilinear.

In the alternate embodiment shown in FIG. 6, the attachments 140 are shaped to extend past the midpoint of the frame 120. This permits the attachments 140 to include mid-length orientation features 143 and the like. In this embodiment, the location of the tabs (not shown) and complementary notches (not shown) can be adjusted accordingly.

The inserts 30 and attachments 40 are preferably injection molded, but can be molded in other ways well known in the art.

If the frame 20 does not include flaps 22, a skirt 23, or a lip 24, then the inserts 30 and attachments 40 can be shaped to snap-fit directly to the edges of the plate. Alternately, the inserts 30 and attachments 40 can be appended to the frame by means different than snap-fitting. For example, the inserts and attachments can be bonded directly to the frame by means of a high-temperature adhesive or the like, in which case engagement features such as the tabs 25 and notches 42 would not be necessary. Also, the inserts and attachments can be configured to form an interference fit with the frame, or can be held in place by separate mechanical fasteners, all of which will be readily appreciated by those skilled in the art.

Once the inserts 30 and the attachments 40 are appended to the frame 20, the frame will compensate for any warpage that may have occurred during formation or that might tend to occur at elevated operating temperatures. The frame 20 will ensure that the inserts and attachments remain properly oriented, as well as correct or limit any non-linearity. As for the acceptable levels of warpage, JEDEC has standards for these as well. For example, a typical solid state tray has nominal upper and lower stack lengths of 311.15 and 311.66 mm, respectively, and upper and lower stack widths of 132.06 and 132.59 mm, respectively. Each of these dimensions should vary by no more than +0.25 mm or −0.13 mm. The flatness tolerance is 0.76 mm. Of course, stricter or more lenient tolerances may be employed.

It should be noted that the relative dimensions of the inserts 30, attachments 40, and frame 20 are somewhat interdependent. The inserts 30 and attachments 40 can be made larger (for example, the inserts can include multiple pockets), and therefore susceptible to greater overall warpage, so long as the frame 20 is strong and stiff enough to correct for the warpage. Conversely, for smaller inserts 30, warpage will not be as much of a concern, and the frame 20 need not be as stiff.

In an alternate embodiment, the pockets and exterior features can be appended to the frame by molding a semi-crystalline outer shell over a metallic frame, preferably directly over it. In this embodiment, the frame can be held in the mold during formation. In the finished product, the frame will act as a core of the tray, and some, most or all of the core will be covered with a shell of semi-crystalline resin. It is on this shell that the pocket interior and JEDEC-type exterior features can be formed.

While the present invention has been described with respect to what is at present considered to be the preferred embodiments, it should be understood that the invention is not limited to the disclosed embodiments. To the contrary, as exemplified above, the invention is intended to cover various modifications and equivalent arrangements included within the spirit and scope of the appended claims. Therefore, the scope of the following claims is intended to be accorded the broadest reasonable interpretation so as to encompass all such modifications and equivalent structures and functions.

We claim:

1. A component carrier tray for holding electrical components, comprising:
    a support frame having at least one opening or concavity therein, the support frame including an engagement surface at a periphery of the opening or concavity; and
    a pocket insert supported by the frame and located in the opening or concavity, the pocket insert being formed of a high temperature semi-crystalline polymer and being adapted to receive and hold at least one of the electrical components, and the pocket insert comprising an upper and a lower engagement protrusion extending from an upper and a lower periphery, respectively, of the pocket insert, wherein the pocket insert snap-fits into the opening or concavity with the engagement surface between the upper and lower engagement protrusions.

2. The tray according to claim 1, wherein a plurality of the pocket inserts are supported by the frame.

3. The tray according to claim 2, wherein the frame comprises a plate having a plurality of openings therein, and each of the pocket inserts fits within one of the openings.

4. The tray according to claim 3, wherein the engagement surface of the frame comprises a flap depending from the plate at the periphery of the opening or concavity, the upper and lower engagement protrusions of the pocket insert comprise, respectively, a flange extending from the upper periphery and a prong extending from the lower periphery of the pocket insert, and each pocket insert fits into one of the openings so that the flange abuts the frame and the prong snaps behind the flap.

5. The component carrier according to claim 2, wherein each pocket insert defines one or more pockets, wherein if each pocket insert defines a plurality of pockets the pockets are identical and are aligned in a single row, and each pocket is dimensioned to receive and hold a single electrical component of a type for which the carrier is designed.

6. The component carrier according to claim 2, wherein each pocket insert defines a single pocket that is dimensioned to receive and hold a single electrical component of a type for which the carrier is designed.

7. The tray according to claim 1, further comprising an attachment supported by the frame, the attachment being formed of a high-temperature semi-crystalline polymer and comprising handling features by which the tray can be machine manipulated.

8. The tray according to claim 7, wherein the frame is substantially rectangular, and the attachment abuts at least part of three edges of the frame.

9. The tray according to claim 8, wherein the frame further comprises an engagement feature on each edge of an opposing pair of the three edges abutted by the attachment, each of the engagement features comprises one of a projection and a recess, and the attachment further includes complementary features positioned to engage the engagement features of the frame to secure the attachment to the frame, each of the complementary features comprising the other of a projection and a recess.

10. The tray according to claim 1, wherein the frame is formed from a sheet of metal.

11. The tray according to claim 1, wherein the frame is formed of a material selected from the group consisting of steel, aluminum alloys, and ceramics.

12. The tray according to claim 11, wherein the frame material comprises stainless steel.

13. The tray according to claim 1, wherein the semi-crystalline polymer comprises a material selected from the group consisting of liquid crystal polyesters, thermoset polyimide, polyester ether ketone, and polyphthalamide.

14. The tray according to claim 13, wherein the material comprises polyester ether ketone.

15. The component carrier according to claim 1, wherein the pocket insert is held by the frame in a fixed position, relative to the frame.

16. A method of assembling a component carrier tray for holding electrical components, comprising the steps of:
providing a support frame having at least one opening or concavity therein, the support frame including an engagement surface at a periphery of the opening or concavity; and
securing a pocket insert to the frame in the opening or concavity, the pocket insert being formed of a high-temperature semi-crystalline polymer and being adapted to receive and hold at least one of the electrical components, and the pocket insert comprising an upper and a lower engagement protrusion extending from an upper and a lower periphery, respectively, of the pocket insert, wherein the pocket insert is secured by snap-fitting into the opening or concavity with the engagement surface between the upper and lower engagement protrusions.

17. The method according to claim 16, wherein a plurality of the pocket inserts are secured to the frame in the step of securing.

18. The method according to claim 17, wherein the frame comprises a plate having a plurality of openings therein, and the step of securing the inserts comprises the step of fitting each of the pocket inserts within a different one of the openings.

19. The method according to claim 18, wherein the engagement surface of the frame comprises a flap depending from the plate at the periphery of the opening or concavity, the upper and lower engagement protrusions of the pocket insert comprise, respectively, a flange extending from the upper periphery and a prong extending from the lower periphery of the pocket insert, and the step of fitting the pocket inserts comprises inserting each pocket insert into one of the openings so that the flange abuts the frame and the prong snaps behind the flap.

20. The method according to claim 17, wherein each pocket insert defines one or more pockets, wherein if each pocket insert defines a plurality of pockets the pockets are identical and are aligned in a single row, and each pocket is dimensioned to receive and hold a single electrical component of a type for which the carrier is designed.

21. The method according to claim 17, wherein each pocket insert defines a single pocket that is dimensioned to receive and hold a single electrical component of a type for which the carrier is designed.

22. The method according to claim 16, further comprising the step of securing an attachment to the frame, the attachment being formed of a high-temperature semi-crystalline polymer and comprising handling features by which the carrier tray can be machine manipulated.

23. The method according to claim 22, wherein the frame is substantially rectangular, and the step of securing the attachment comprises abutting the attachment against at least part of three edges of the frame.

24. The method according to claim 23, wherein
the frame further comprises an engagement feature on each edge of an opposing pair of the three edges abutted by the attachment, each of the engagement features comprising one of a projection and a recess,
the attachment further includes complementary features matching the engagement features of the frame, each of the complementary features comprising the other of a projection and a recess, and
the step of securing the attachment further comprises engaging the engagement features of the frame with the complementary features of the attachment.

25. The method according to claim 16, wherein the step of providing the frame comprises forming the frame from a sheet of metal.

26. The method according to claim 16, wherein the step of providing the frame comprises forming the frame from a material selected from the group consisting of steel, aluminum alloys, and ceramics.

27. The method according to claim 26, wherein the frame material comprises stainless steel.

28. The method according to claim 16, wherein the semi-crystalline polymer comprises a material selected from the group consisting of liquid crystal polyesters, thermoset polyimide, polyester ether ketone, and polyphthalamide.

29. The method according to claim 28, wherein the material comprises polyester ether ketone.

30. The method according to claim 16, wherein the pocket insert is secured to the frame in a fixed position, relative to the frame.

31. A component carrier tray for holding electrical components, comprising:
a support frame; and
a pocket insert formed of a high-temperature semi-crystalline polymer, adapted to receive and hold at least one of the electrical components, and including means for securement to the support frame,
wherein the support frame includes means for supporting the pocket insert which combines with the means for securement to comprise means for correcting any warpage in the pocket insert.

32. The tray according to claim 31, wherein the tray includes a plurality of the pocket inserts, and the supporting means is operable to support each of the inserts with compensation for any warpage thereof.

33. The tray according to claim 32, wherein the supporting means comprises a plate having a plurality of openings therein, and each pocket insert fits within a different one of the openings.

34. The tray according to claim 33, wherein the supporting means further comprises a flap depending from a periphery of each of the openings, each pocket insert includes a flange extending from an upper periphery and a prong extending from a lower periphery of the pocket insert, and each pocket insert fits into one of the openings so that the flange abuts the frame and the prong snaps behind the flap.

35. The tray according to claim 32, wherein each pocket insert defines one or more pockets, wherein if each pocket insert defines a plurality of pockets the pockets are identical and are aligned in a single row, and each pocket is dimensioned to receive and hold a single electrical component of a type for which the carrier is designed.

36. The tray according to claim 32, wherein each pocket insert defines a single pocket that is dimensioned to receive and hold a single electrical component of a type for which the carrier is designed.

37. The tray according to claim 31, further comprising an attachment formed of a high-temperature semi-crystalline polymer, the attachment comprising handling features by which the tray can be machine manipulated, and the supporting means is also for supporting the attachment so as to compensate for any warpage in the attachment.

38. The tray according to claim 37, wherein the supporting means comprises a substantially rectangular plate, the attachment engages three edges of the plate when supported by the supporting means, each edge of an opposing pair of the three edges of the plate includes an engagement feature, each engagement feature comprises one of a projection or a recess, and the attachment includes complementary features which engage the engagement features when the attachment is supported by the supporting means, each complementary feature comprising the other of a projection or a recess.

39. The tray according to claim 31, wherein the supporting means comprises a frame formed from a sheet of metal.

40. The tray according to claim 31, wherein the supporting means comprises a frame formed of a material selected from the group consisting of steel, aluminum alloys, and ceramics.

41. The tray according to claim 40, wherein the frame material comprises stainless steel.

42. The tray according to claim 31, wherein the semi-crystalline polymer comprises a material selected from the group consisting of liquid crystal polyesters, thermoset polyimide, polyester ether ketone, and polyphthalamide.

43. The tray according to claim 42, wherein the material comprises polyester ether ketone.

44. The tray according to claim 31, wherein the pocket insert is held by the means for supporting in a fixed position, relative to the frame.

45. A component carrier assembly, comprising:
a support frame having at least one opening or concavity therein, the support frame including an engagement surface at a periphery of the opening or concavity;
a pocket insert supported by the frame and located in the opening or concavity, the pocket insert being formed of a high temperature semi-crystalline polymer, and the pocket insert comprising an upper and a lower engagement protrusion extending from an upper and a lower periphery, respectively, of the pocket insert, wherein the pocket insert snap-fits into the opening or concavity with the engagement surface between the upper and lower engagement protrusions; and
an electrical component disposed within the pocket insert.

46. The assembly according to claim 45, wherein a plurality of the pocket inserts are supported by the frame, and a plurality of the electrical components are disposed at least one within each pocket insert.

47. The assembly according to claim 46, wherein the frame comprises a plate having a plurality of openings therein, and each of the pocket inserts fits within a different one of the openings.

48. The assembly according to claim 47, wherein the engagement surface of the frame comprises a flap depending from the plate at the periphery of the opening or concavity, the upper and lower engagement protrusions of the pocket insert comprise, respectively, a flange extending from the upper periphery and a prong extending from the lower periphery of the pocket insert, and each pocket insert fits into one of the openings so that the flange abuts the frame and the prong snaps behind the flap.

49. The assembly according to claim 46, wherein each pocket insert defines one or more pockets, wherein if each pocket insert defines a plurality of pockets the pockets are identical and are aligned in a single row, and each pocket is dimensioned to receive and hold a single electrical component of a type for which the carrier is designed.

50. The assembly according to claim 46, wherein each pocket insert defines a single pocket that is dimensioned to receive and hold a single electrical component of a type for which the carrier is designed.

51. The assembly according to claim 45, further comprising an attachment supported by the frame, the attachment being formed of a high-temperature semi-crystalline polymer and comprising handling features by which the tray can be machine manipulated.

52. The assembly according to claim 51, wherein the frame is substantially rectangular, and the attachment abuts at least part of three edges of the frame.

53. The assembly according to claim 52, wherein the frame further comprises an engagement feature on each edge of an opposing pair of the three edges abutted by the attachment, each of the engagement features comprises one of a projection and a recess, and the attachment further includes complementary features positioned to engage the engagement features of the frame to secure the attachment to the frame, each of the complementary features comprising the other of a projection and a recess.

54. The assembly according to claim 45, wherein the frame is formed from a material selected from the group consisting of metals and ceramics.

55. The assembly according to claim 45, wherein the semi-crystalline polymer comprises a material selected from the group consisting of liquid crystal polyesters, thermoset polyimide, polyester ether ketone, and polyphthalamide.

56. The assembly according to claim 55, wherein the material comprises polyester ether ketone.

57. The assembly according to claim 45, wherein the pocket insert is held by the frame in a fixed position, relative to the frame.

58. A component carrier tray for holding electrical components, comprising:
a support frame having at least one opening or concavity therein; and a pocket insert supported by the frame and located in the opening or concavity, the pocket insert being formed of a high-temperature semi-crystalline polymer and being adapted to receive and hold at least one of the electrical components, wherein the frame engages a periphery of the pocket insert and is stiff enough to restrain the pocket insert from bending into a non-aligned orientation if the pocket insert is warped.

59. A method of assembling a component carrier tray for holding electrical components, comprising the steps of:

providing a support frame having at least one opening or concavity therein; and securing a pocket insert to the frame in the opening or concavity so that the frame engages a periphery of the pocket insert, the pocket insert being formed of a high-temperature semi-crystalline polymer and being adapted to receive and hold at least one of the electrical components, wherein the frame has sufficient stiffness to restrain the pocket insert from bending into a non-aligned orientation if the pocket insert is warped.

60. A component carrier tray for holding electrical components, comprising:

a pocket insert formed of a high-temperature semi-crystalline polymer and adapted to receive and hold at least one of the electrical components; and means for supporting the pocket insert so as to compensate for any warpage in the pocket insert, wherein the means for supporting engages a periphery of the pocket insert and is stiff enough to restrain the pocket insert from bending into a non-aligned orientation if the pocket insert is warped.

61. A component carrier assembly, comprising:

a support frame having at least one opening or concavity therein;

a pocket insert supported by the frame and located in the opening or concavity, the pocket insert being formed of a high-temperature semi-crystalline polymer; and an electrical component disposed within the pocket insert, wherein the frame engages a periphery of the pocket insert and is stiff enough to restrain the pocket insert from bending into a non-aligned orientation if the pocket insert is warped.

* * * * *

UNITED STATES PATENT AND TRADEMARK OFFICE
CERTIFICATE OF CORRECTION

PATENT NO. : 6,227,372 B1
DATED : May 8, 2001
INVENTOR(S) : Thomas et al.

It is certified that error appears in the above-identified patent and that said Letters Patent is hereby corrected as shown below:

<u>Column 1,</u>
Line 11, "anialog" should read " analog --.

<u>Column 2,</u>
Line 36, "ware" should read "warp" --.
Line 42, "add" should read "and" --.

Signed and Sealed this

Twenty-seventh Day of November, 2001

*Attest:*

*Attesting Officer*

NICHOLAS P. GODICI
*Acting Director of the United States Patent and Trademark Office*